(12) United States Patent
Gabara et al.

(10) Patent No.: US 7,138,814 B2
(45) Date of Patent: Nov. 21, 2006

(54) INTEGRATED CIRCUIT WITH CONTROLLABLE TEST ACCESS TO INTERNAL ANALOG SIGNAL PADS OF AN AREA ARRAY

(75) Inventors: Thaddeus John Gabara, Murray Hill, NJ (US); Carol Ann Huber, Macungie, PA (US); Bernard Lee Morris, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 27 days.

(21) Appl. No.: 10/719,193

(22) Filed: Nov. 21, 2003

(65) Prior Publication Data
US 2005/0110511 A1     May 26, 2005

(51) Int. Cl.
*G01R 31/02* (2006.01)
(52) U.S. Cl. .................................................... 324/763
(58) Field of Classification Search ............... 324/73.1, 324/158.1, 754, 763, 765; 371/15.1, 22.1, 371/22.3, 22.5, 22.6, 25.1
See application file for complete search history.

(56) References Cited

U.S. PATENT DOCUMENTS

| 4,336,495 | A |   | 6/1982 | Hapke |
| 4,743,841 | A |   | 5/1988 | Takeuchi |
| 5,053,700 | A | * | 10/1991 | Parrish ........................ 324/537 |
| 5,059,899 | A | * | 10/1991 | Farnworth et al. .......... 324/73.1 |
| 5,097,205 | A | * | 3/1992 | Toyoda ........................ 324/763 |
| 5,130,645 | A |   | 7/1992 | Levy |
| 5,220,280 | A | * | 6/1993 | Visel et al. .................. 324/754 |
| 5,418,470 | A |   | 5/1995 | Dagostino et al. |
| 5,469,075 | A | * | 11/1995 | Oke et al. ..................... 324/763 |
| 5,539,325 | A | * | 7/1996 | Rostoker et al. ............. 324/763 |
| 5,565,801 | A |   | 10/1996 | Ernst |
| 5,969,538 | A | * | 10/1999 | Whetsel ....................... 324/763 |
| 6,130,546 | A |   | 10/2000 | Azizi |
| 6,313,655 | B1 |   | 11/2001 | Krause |
| 6,333,706 | B1 |   | 12/2001 | Cummings et al. |
| RE37,500  | E  |   | 1/2002 | Lee |
| 6,369,599 | B1 |   | 4/2002 | Wright et al. |
| 6,590,407 | B1 |   | 7/2003 | Habersetzer et al. |
| 6,844,751 | B1 | * | 1/2005 | Marshall et al. ............. 324/765 |
| 2002/0152439 | A1 |   | 10/2002 | Kim et al. |

* cited by examiner

*Primary Examiner*—Jermele Hollington

(57) ABSTRACT

An integrated circuit die comprises an internal signal pad arranged at a location away from a periphery of the die, a peripheral signal pad arranged proximate the periphery of the die, and a switch coupled between the internal signal pad and the peripheral signal pad. The switch is configurable in at least a first state in which the internal signal pad is not operatively connected to the peripheral signal pad, and a second state in which the internal signal pad is operatively connected to the peripheral signal pad, responsive to a control signal having one of respective first and second signal characteristics. The switch is configured in the first state during normal operation of the integrated circuit die, and is configured in the second state to permit test access to the internal signal pad via the peripheral signal pad.

18 Claims, 6 Drawing Sheets

INTEGRATED CIRCUIT WITH CONTROLLABLE TEST ACCESS TO INTERNAL ANALOG SIGNAL PADS OF AN AREA ARRAY

FIELD OF THE INVENTION

The present invention relates generally to integrated circuits, and more particularly to techniques for providing test access to internal signal pads of an area array or other internal portions of an integrated circuit die.

BACKGROUND OF THE INVENTION

Integrated circuits have to be able to send and to receive electrical signals to and from external or "off-chip" elements. This communication with off-chip elements is typically achieved through the use of buffer circuits, also commonly referred to simply as "buffers." FIGS. 1 and 2 show the layouts of conventional integrated circuits, illustrating the placement of buffer circuits therein.

With reference initially to FIG. 1, an integrated circuit die 100 includes a plurality of buffer circuits 102 arranged adjacent to its periphery as shown. Associated with each of the buffer circuits 102 is a corresponding bonding pad 104, which may be viewed as an example of what is more generally referred to herein as a signal pad.

FIG. 2 shows an integrated circuit die 100' which includes peripherally-arranged buffer circuits 102 as in FIG. 1 but also includes an area array 106 comprising additional buffer circuits. Again, associated with each of the buffer circuits 102 is a corresponding bonding pad 104. This placement allows many more buffer circuits to be placed on a single integrated circuit die than the simple outer perimeter placement of FIG. 1. During manufacturing of a packaged integrated circuit with area array buffers, a special technique called solder bumping is often used to allow all of the bonding pads in the area array to be connected to corresponding signal paths in the structure in which the integrated circuit die is packaged.

A problem associated with use of area array buffers such as those shown in FIG. 2 is that it is difficult to gain access to internal analog signal pads during testing that occurs before the integrated circuit die is packaged. Such pre-package testing typically involves testing the integrated circuit die while it is still part of the semiconductor wafer, that is, before the wafer is cut into chips which are individually packaged, and is thus also referred to herein as wafer-level testing. The wafer-level testing is carried out using a wire-type wafer probe card comprising many short but stiff wires, referred to as test probes, that temporarily connect the peripheral bonding pads of the integrated circuit die to an associated test apparatus.

FIG. 3 illustrates the application of a set of wafer test probes 108 to a set of bonding pads associated with peripheral buffers 110 on one side of the integrated circuit die 100'. For clarity and simplicity of illustration, this figure shows only the left side of the integrated circuit die being probed, but in practice all four sides are probed at the same time using the same wire-type wafer probe card. Unfortunately, a standard wire-type wafer probe card can only contact the peripheral bonding pads, and cannot reach the bonding pads which are inside the area array.

Although there is another type of wafer probe card, known as a membrane probe card, which can reach internal bonding pads within an area array during wafer-level testing, this type of card is generally very expensive and difficult to use.

One possible alternative is to provide permanent connections between the bonding pads inside the area array to corresponding peripheral bonding pads for wafer-level testing. However, this approach is usually appropriate only for digital signal pads, since for analog signal pads the connecting wires may add unacceptable amounts of parasitic resistance and capacitance, thereby degrading analog signal performance during normal operation of the subsequently-packaged integrated circuit.

It is therefore apparent that a need exists for improved techniques for providing wafer-level test access to internal analog signal pads of an integrated circuit die, without the excessive cost and other difficulties associated with use of a membrane probe card.

SUMMARY OF THE INVENTION

The present invention provides enhanced test access to internal bonding pads or other types of signal pads of an integrated circuit die, in a manner which overcomes one or more of the problems identified above.

In accordance with one aspect of the invention, an integrated circuit die comprises an internal signal pad arranged at a location away from a periphery of the die, a peripheral signal pad arranged proximate the periphery of the die, and a switch coupled between the internal signal pad and the peripheral signal pad. The switch is configurable in at least a first state in which the internal signal pad is not operatively connected to the peripheral signal pad, and a second state in which the internal signal pad is operatively connected to the peripheral signal pad, responsive to a control signal having one of respective first and second signal characteristics, such as respective first and second signal levels. The switch is configured in the first state during normal operation of the integrated circuit die, and is configured in the second state to permit test access to the internal signal pad via the peripheral signal pad.

The internal signal pad may be an internal analog signal pad that is part of an area array of the integrated circuit die. The switch is preferably arranged nearer to the internal signal pad than to the peripheral signal pad. For example, the switch may be arranged immediately adjacent to the internal signal pad. The switch may thus be arranged so as to minimize or otherwise reduce parasitic elements associated with the internal signal pad when the switch is in the first state.

Test access to the internal signal pad via the peripheral signal pad may involve establishing electrical contact between an external probe and the peripheral signal pad, with the switch being configured in the second state. The external probe may comprise a test probe of an otherwise conventional wire-type wafer probe card. The switch may thus be configured in the second state in conjunction with wafer-level testing of the integrated circuit die prior to separation of the die from a corresponding semiconductor wafer.

In accordance with another aspect of the invention, the integrated circuit die may further comprise a control circuit configured to generate the control signal for controlling the state of the switch. For example, the control circuit may comprise first and second inverters connected in series, with an output of the second inverter being coupled to a control signal input of the switch, and an input of the first inverter being coupled via at least one resistor to a supply voltage terminal of the integrated circuit die. The input of the first inverter is also preferably coupled to an additional peripheral signal pad of the integrated circuit die. Single-inverter or no-inverter versions of this example control circuit, as well as other types of control circuits, may also be used.

Advantageously, the invention in an illustrative embodiment allows efficient test access to internal analog signal pads of an integrated circuit die, without the excessive cost and other difficulties associated with use of a membrane probe card, and without degrading analog signal performance during normal operation of the corresponding packaged integrated circuit.

DETAILED DESCRIPTION OF THE INVENTION

The present invention will be illustrated herein in the context of a number of exemplary integrated circuit dies, and test applications involving wafer-level testing of such dies using a wire-type wafer probe card. It should be understood, however, that the particular arrangements shown are provided by way of illustrative example only, and not intended to limit the scope of the invention in any way. As will become apparent, the techniques of the invention are utilizable in a wide variety of other integrated circuit test applications in which it is desirable to obtain access to internal analog signal pads of an integrated circuit area array, or other types of internal signal pads of an integrated circuit.

The term "internal signal pad" as used herein is intended to include a bonding pad or other type of signal pad that is arranged at a location away from a periphery of an integrated circuit die. For example, such a signal pad may be associated with a non-peripheral buffer circuit of an area array within the integrated circuit die.

An internal signal pad may be distinguished from a "peripheral signal pad," which is intended to include a bonding pad or other type of signal pad arranged adjacent to or otherwise proximate a peripheral edge of an integrated circuit die.

The term "analog signal pad" as used herein is intended to include a bonding pad or other type of signal pad having an analog signal associated therewith in a normal operating mode of the corresponding integrated circuit.

Figure 1:
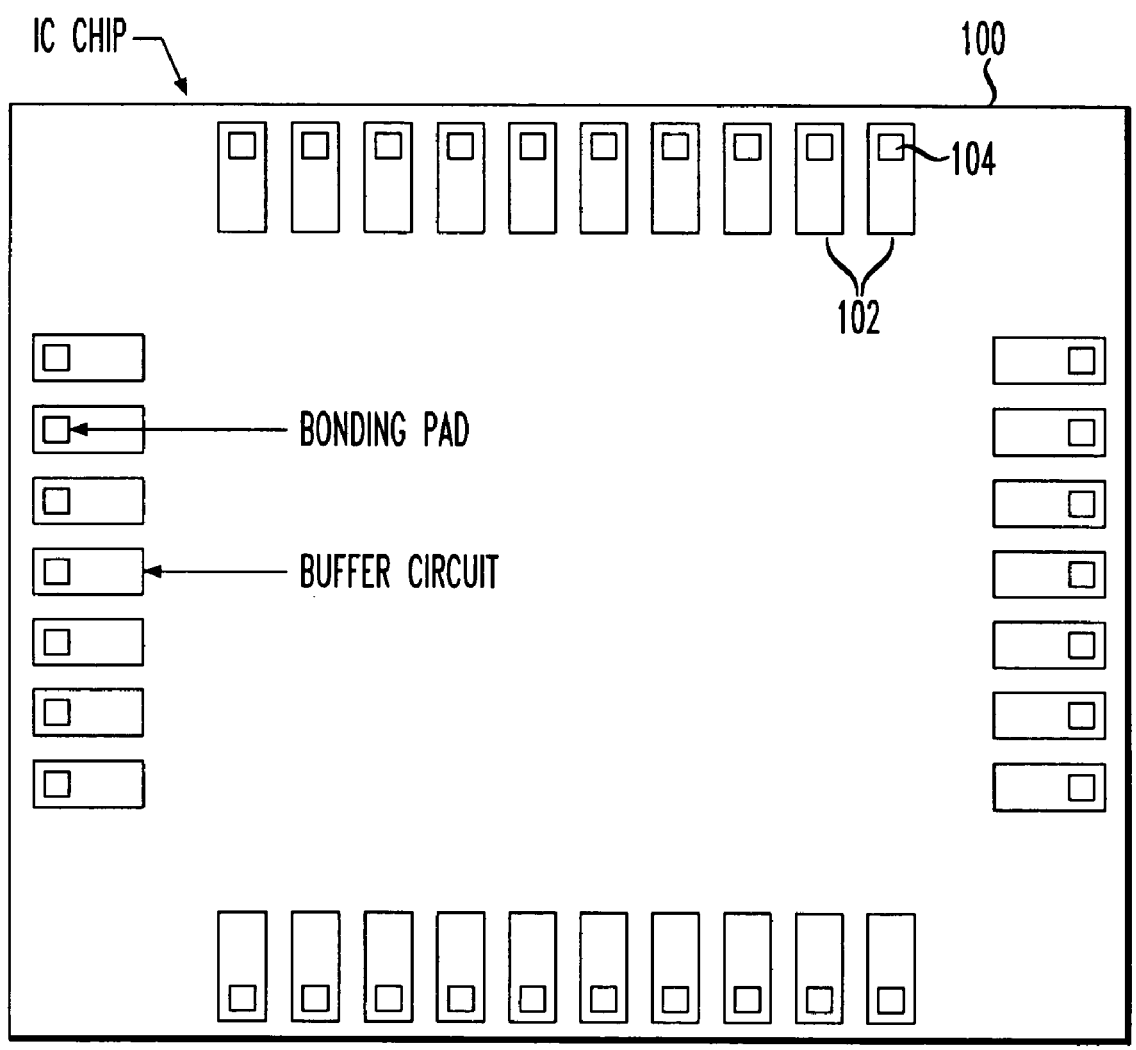
FIG. 1 shows a conventional integrated circuit die with peripheral buffer circuitry.
Figure 2:
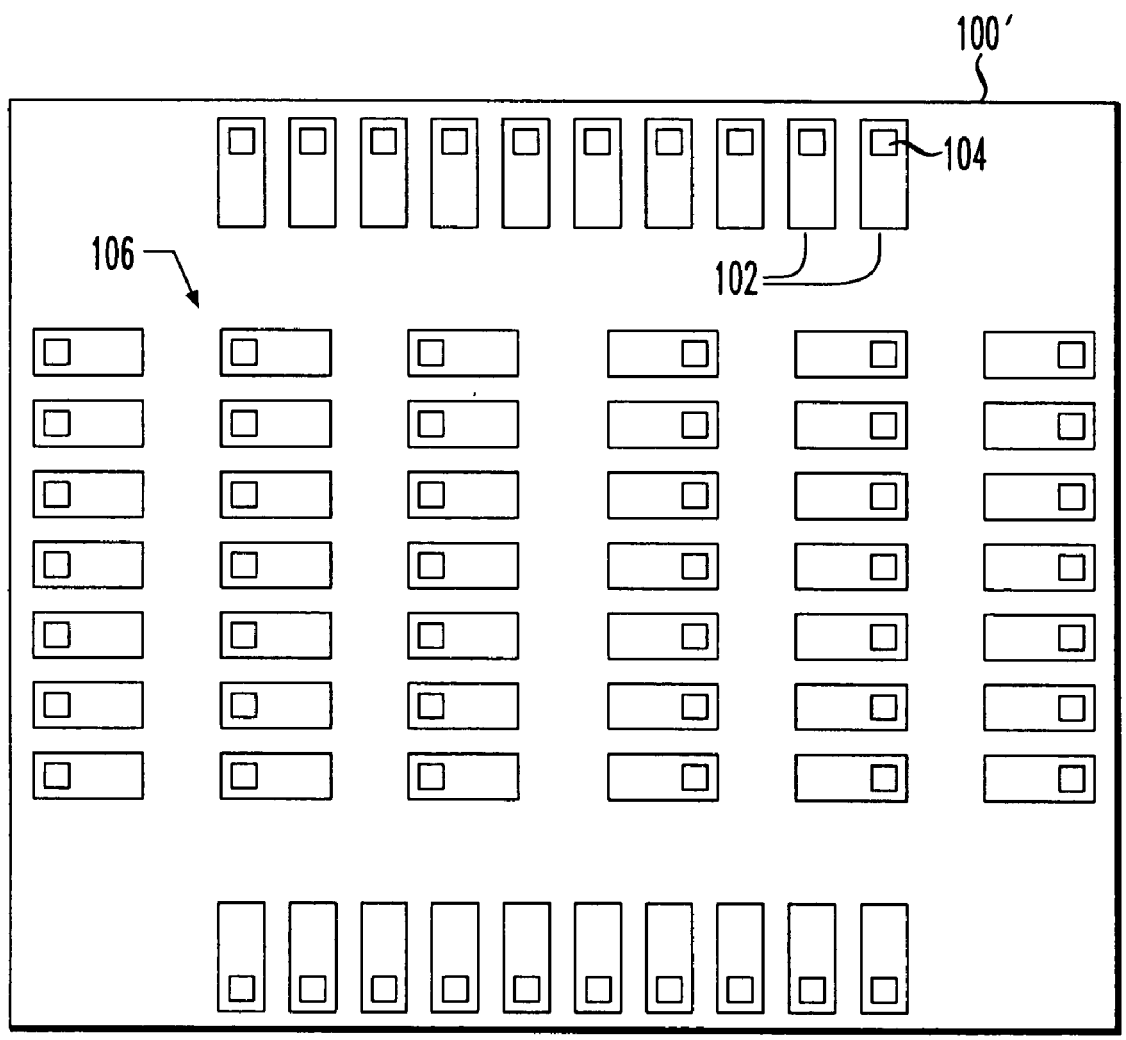
FIG. 2 shows a conventional integrated circuit die which includes buffer circuitry arranged in the form of an area array.
Figure 3:
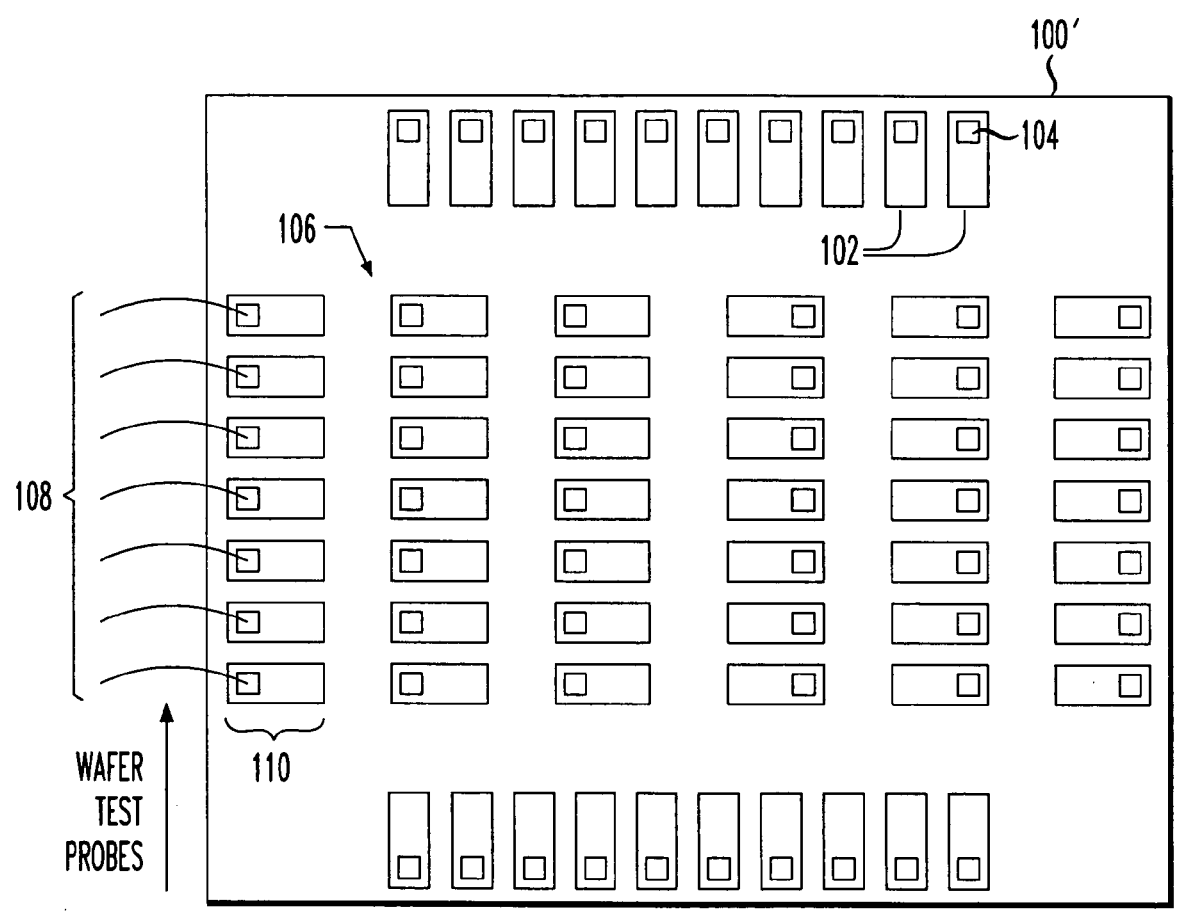
FIG. 3 illustrates the manner in which signal pads on one side of the FIG. 2 integrated circuit die may be accessed using wire-type wafer probe card test probes in accordance with the prior art.
Figure 4:
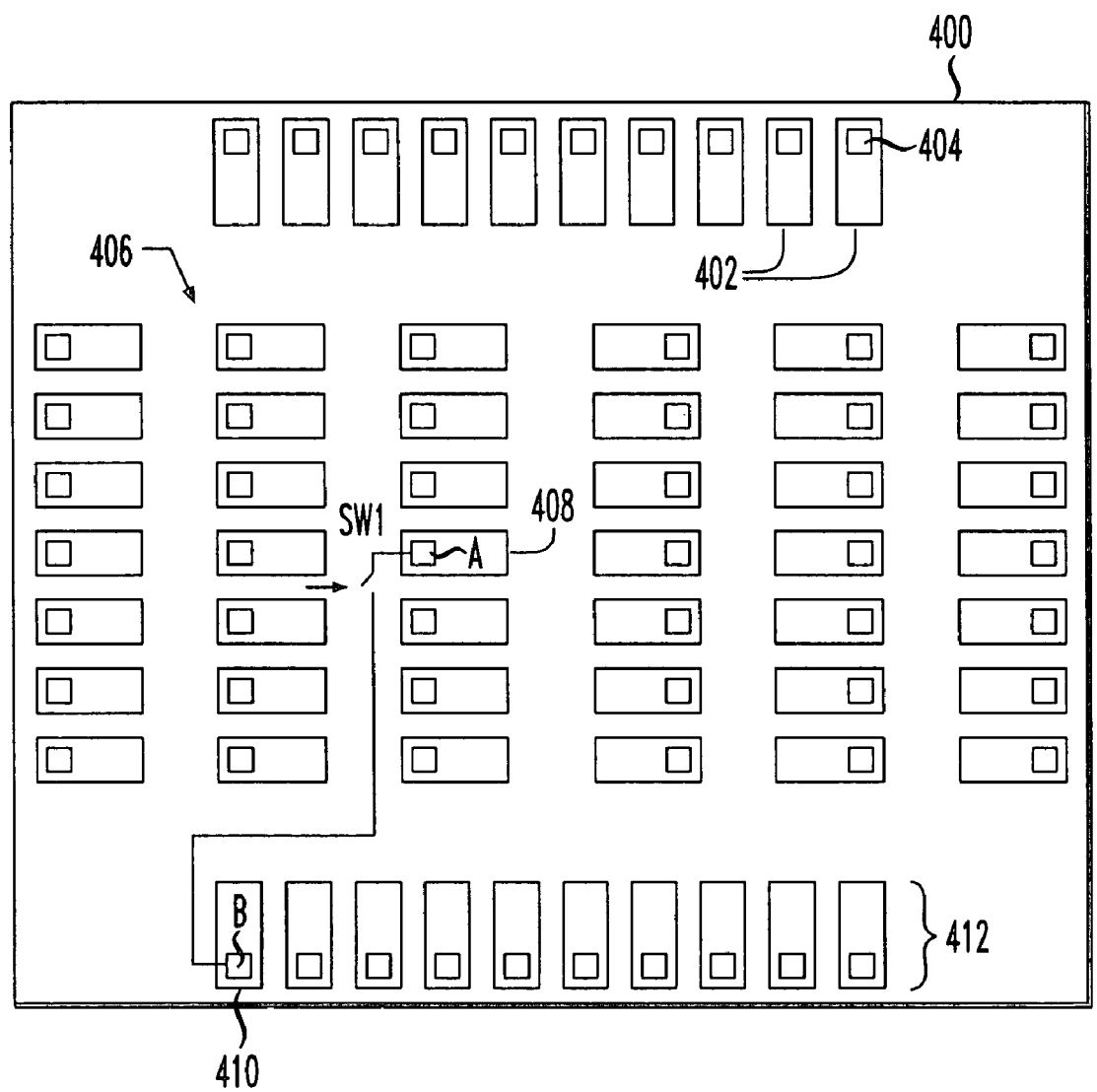
FIG. 4 shows an integrated circuit die configured in accordance with an illustrative embodiment of the invention.

FIG. 4 shows an integrated circuit die 400 in accordance with an illustrative embodiment of the invention. The integrated circuit die 400 includes a plurality of buffer circuits 402 arranged adjacent to its periphery as shown, and an area array 406 comprising additional buffer circuits 402. Associated with each of the buffer circuits 402 is a corresponding bonding pad 404. As noted previously, bonding pads such as bonding pads 404 may be viewed as examples of what are more generally referred to herein as signal pads. Any bonding pad referred to herein may be replaced with another type of signal pad, such as a signal pad not otherwise suitable for utilization in a bonding operation.

It should be noted that an "area array" as the term is used herein may include only internal buffer circuits and their associated signal pads, or a combination of internal and peripheral buffer circuits and their associated signal pads. The area array 406 may therefore be viewed as comprising one or more of the peripheral buffer circuits and associated signal pads in the embodiment shown in FIG. 4.

In accordance with one aspect of the invention, the integrated circuit die 400 further includes an internal bonding pad A, a peripheral bonding pad B, and a switch SW1 coupled between the internal bonding pad A and the peripheral bonding pad B as shown. The internal bonding pad A is associated with a buffer circuit 408 within the area array 406 and arranged at a location away from a periphery of the die. The peripheral bonding pad B is associated with a buffer circuit 410 in a set 412 of buffer circuits, and arranged proximate the periphery of the die.

The switch SW1 is configurable in at least a first state in which the internal bonding pad A is not operatively connected to the peripheral bonding pad B, and a second state in which the internal bonding pad A is operatively connected to the peripheral bonding pad B. The switch is configurable in one of the first and second states responsive to a control signal having one of first and second signal characteristics, respectively. The first and second signal characteristics may be, by way of example, first and second signal levels of the control signal, such as a logic '1' level and a logic '0' level, respectively. Of course, other signals levels or signal characteristics may be used to control the switching of SW1.

It is also to be appreciated that the invention can use a variety of different switching arrangements in place of or in addition to the simplified single-throw arrangement shown in FIG. 4. For example, the switch SW1 may be replaced with an arrangement of multiple switches with additional logic circuitry, collectively having more than two switching states associated therewith. The term "switch" as used herein is intended to encompass these and other multiple switch arrangements as well as other types of switching circuitry, in addition to the simple single-throw switch shown in the figure.

The integrated circuit die 400 also preferably includes a control circuit suitable for generating a control signal for application to a control signal input of the switch SW1, although such a control circuit is not shown in FIG. 4 for clarity and simplicity of illustration. However, an example control circuit of this type will be described below in conjunction with FIG. 5.

The term "control signal" as used herein is intended to include a single signal or a set of multiple signals. The invention does not require the use of any particular control signal arrangement for controlling the switching of the switch SW1 or other type of switch.

Generally, the switch SW1 is configured in the first state during normal operation of the integrated circuit die, and is configured in the second state to permit test access to the internal bonding pad A via the peripheral bonding pad B.

The internal bonding pad A will typically be connected to a lead of a leadframe or similar packaging structure in conjunction with the process of packaging of the integrated circuit die 400. As noted above, in normal use, after the integrated circuit die is packaged, the switch SW1 is configured in the first state, which in the illustrative embodiment may be viewed as an open or "off" state.

It should be noted that the particular configuration shown in FIG. 4 is presented by way of illustrative example only, and should not be construed as limiting the scope of the invention in any way.

For example, although only a single switch is shown in this embodiment, it is contemplated that multiple such switches may be included within a given die, each providing a controllable connection between a corresponding internal bonding pad or other type of signal pad and a peripheral bonding pad or other type of signal pad. An example of such a multiple-switch embodiment will be described below in conjunction with FIG. 7.

In addition, although each bonding pad in the FIG. 4 embodiment is associated with a corresponding buffer circuit, this is not required, and in other embodiments all bonding pads or other signal pads need not necessarily have corresponding buffer circuits associated therewith. The buffer circuits and bonding pads or other signal pads may be entirely conventional in design, and the invention is not limited with regard to the particular number, type and arrangement of buffer circuits or signal pads used in a given embodiment.

The internal bonding pad A in the illustrative embodiment preferably comprises an analog signal pad. As noted above, the conventional approach of providing permanent connections between the bonding pads inside the area array to corresponding peripheral bonding pads for wafer-level testing is usually appropriate only for digital signal pads. This is because for analog signal pads the connecting wires may add unacceptable amounts of parasitic resistance and capacitance, thereby degrading analog signal performance during normal operation of the subsequently-packaged integrated circuit.

Also, the switch SW1 is preferably arranged nearer to the internal bonding pad A than to the peripheral bonding pad B. For example, the switch may be arranged immediately adjacent to the internal bonding pad, as is illustrated in FIG. 4. Advantageously, this configuration helps to minimize or otherwise reduce parasitic elements associated with the internal bonding pad when the switch is in the first state, that is, the state associated with normal operation of the integrated circuit die 400.

The test access to the internal bonding pad A via the peripheral bonding pad B involves establishing electrical contact between an external probe and the peripheral bonding pad, with the switch SW1 being configured in the second state, which in the illustrative embodiment may be viewed as a closed or "on" state. The external probe may comprise, by way of example, a test probe of an otherwise conventional wire-type wafer probe card. The configuration and operation of such wire-type wafer probe cards are well understood in the art, and therefore not described in detail herein.

Examples of wafer probe cards suitable for use in conjunction with the present invention include conventional wafer probe cards of a type commercially available from vendors such as Kulicke & Soffa, of Gilbert, Ariz., USA, MicroProbe, Inc. of Carlsbad, Calif., USA, or SV Probe, Inc. of San Jose, Calif., USA.

The switch SW1 in the illustrative embodiment is configured in the second state in conjunction with wafer-level testing of the integrated circuit die 400 prior to separation of the die from a corresponding semiconductor wafer. During such testing the integrated circuit die 400 usually comprises an element of a semiconductor wafer containing a plurality of dies. Typically, the wafer is then separated into its individual dies, and each of the dies is subsequently encapsulated or otherwise packaged to form a packaged integrated circuit, as will be described below in conjunction with the diagram of FIG. 6.

Thus, during wafer-level testing the switch SW1 is in its closed or "on" state, connecting the internal bonding pad A to the peripheral bonding pad B. The switch preferably allows bidirectional communication between a test apparatus and analog circuitry coupled to the internal bonding pad in this state. Although the parasitic resistance and capacitance of the connection between bonding pads A and B may detract from the measured performance of the analog circuitry during wafer-level testing, such effects can be easily accommodated by altering the test specifications to account for the degraded performance. More important, however, is that when the switch is in its open or "off" state during normal operation of the integrated circuit die, the analog performance of the die is not significantly degraded.

The illustrative embodiment of the invention as shown in FIG. 4 provides a number of significant advantages over the conventional techniques previously described. For example, it allows particularly efficient test access to internal analog signal pads of an integrated circuit die, without the excessive cost and other difficulties associated with use of a membrane probe card, and without degrading analog signal performance during normal operation of the corresponding packaged integrated circuit.

Figure 5:
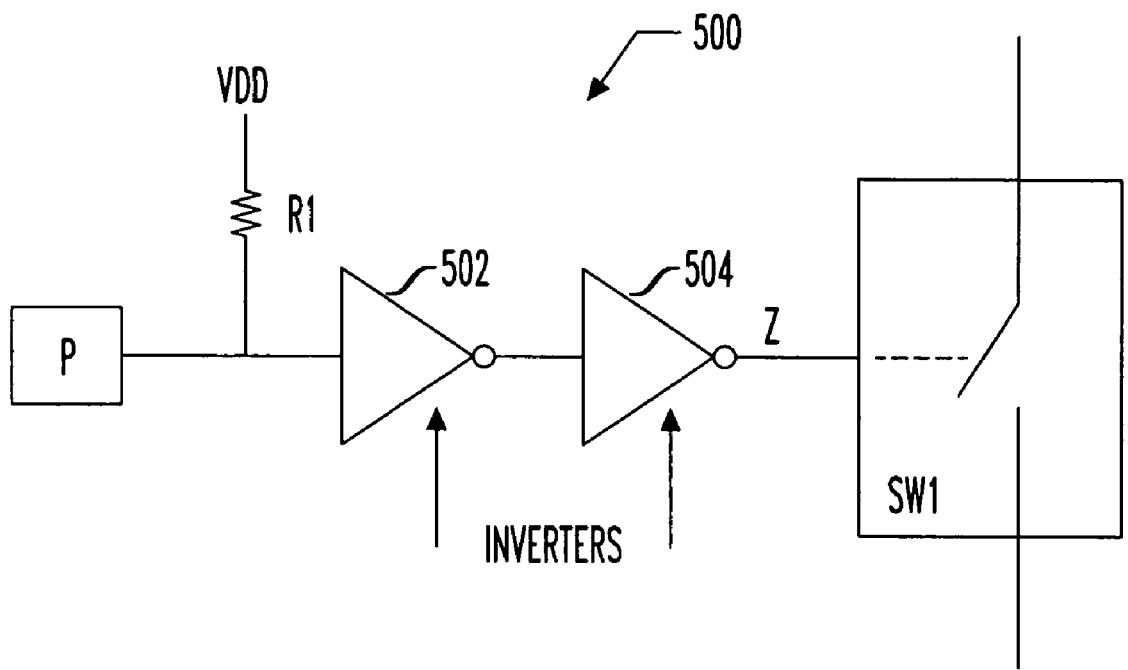
FIG. 5 is a schematic diagram of one possible implementation of a control circuit for controlling the state of a switch in the FIG. 4 integrated circuit die.

FIG. 5 shows an example control circuit 500 for controlling the state of the switch SW1 in the FIG. 4 integrated circuit die 400. As indicated above, this control circuit is assumed to be part of the integrated circuit die 400 in the illustrative embodiment, although not shown as such in FIG. 4. In other embodiments, the control circuit for controlling the state of the switch SW1 may be external to the integrated circuit die on which the switch is located.

The control circuit 500 in this example comprises first and second inverters 502 and 504 connected in series, with an output of the second inverter 504 being coupled to a control signal input of the switch SW1. The input of the first inverter 502 is coupled via a resistor R1 to a supply voltage terminal VDD of the integrated circuit die. The resistor R1 preferably has a large value, greater than about 10,000 ohms. Other values, generally between about 50 ohms and more than about 1 Mohm, may also be used. The input of the first inverter 502 is also coupled to an additional signal pad P of the integrated circuit die.

The signal pad P may be, by way of example, a peripheral bonding pad of the integrated circuit die, other than the peripheral bonding pad B previously described herein. Responsive to the signal applied to the input of inverter 502, the control circuit 500 generates a control signal Z which is applied to a control input of the switch SW1.

During wafer-level testing, the signal pad P may be held at approximately ground potential through a low resistance, such that the input to the first inverter 502 is at a logic '0' level, and the control signal Z is also at a logic '0' level. In this embodiment, this causes the switch SW1 to enter its second state, that is, its closed or "on" state. During normal operation, after the integrated circuit die has been packaged, signal pad P is typically left unconnected, so that resistor RI pulls up the input of inverter 502 to a logic '1' level, and the control signal Z is also at a logic '1' level. In this embodiment, this causes the switch SW1 to enter its first state, that is, its open or "off" state, such that internal bonding pad A is disconnected from peripheral bonding pad B.

The control circuit 500 as shown in FIG. 5 should be understood as being merely an example of one possible control circuit suitable for use with the present invention. Other examples include a single-inverter control circuit or a no-inverter control circuit, both otherwise configured in a manner similar to that described in conjunction with FIG. 5. Thus, the two inverters of the control circuit 500 may be replaced with a single inverter, or eliminated altogether. In the case of the single-inverter control circuit, the switching logic response of switch SW1 may be adjusted accordingly, to the complement of that used in FIG. 5.

These and many other types of switch circuitry may be used in implementing the invention, as will be readily appreciated by those skilled in the art. As indicated previously, the term "switch" as used herein is intended to be construed generally, and is intended to include any circuitry or other arrangement of hardware, software or firmware, or combinations thereof, capable of controlling the connection of an internal signal pad to a peripheral signal pad in the manner described herein.

Figure 6:
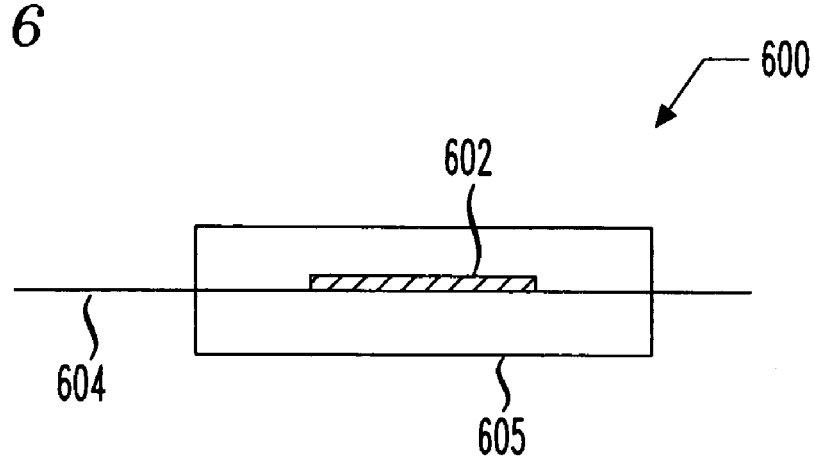
FIG. 6 is a cross-sectional view of an example packaged integrated circuit incorporating the integrated circuit die of FIG. 4.

FIG. 6 is a cross-sectional view of an example packaged integrated circuit 600 incorporating an integrated circuit die such as that shown in FIG. 4. The packaged integrated circuit 600 includes an integrated circuit die 602, which is coupled to a leadframe 604. The coupling between the leadframe and the die may be, for example, via one or more wire bonds, adhesive or thermal bonding, or other coupling mechanisms. The integrated circuit die 602 and leadframe 604 are at least partially encapsulated or otherwise enclosed by a packaging material 605. The leadframe, packaging material and manner in which the die is packaged may be entirely conventional, and are therefore not further described herein. Also, certain elements have been omitted from the figure for clarity and simplicity of illustration. Such omitted elements may include, by way of example, solder bumps, wire bonds, etc.

It is also apparent from the foregoing that the present invention can be embodied as a method of providing access to an internal signal pad of an integrated circuit die. Such a method may include the steps of configuring the switch SW1 in the first state during normal operation of the integrated circuit die, and configuring the switch in the second state to permit test access to the internal signal pad via the peripheral signal pad. As a more particular example, the second step in such an embodiment may be performed during wafer-level testing, as previously described, with the integrated circuit die still being part of the semiconductor wafer on which it is formed, while the first step may be performed later, upon power-up of a packaged integrated circuit containing the integrated circuit die. The invention is therefore not limited with regard to the particular ordering of these or any other method steps.

As indicated previously, although the illustrative embodiment as described in conjunction with FIG. 4 shows only a single internal-peripheral signal pad pair being coupled by a switch, it is to be appreciated that any desired number of such internal-peripheral signal pad pairs may be configured in a similar manner, using a corresponding number of additional switches.

Figure 7:
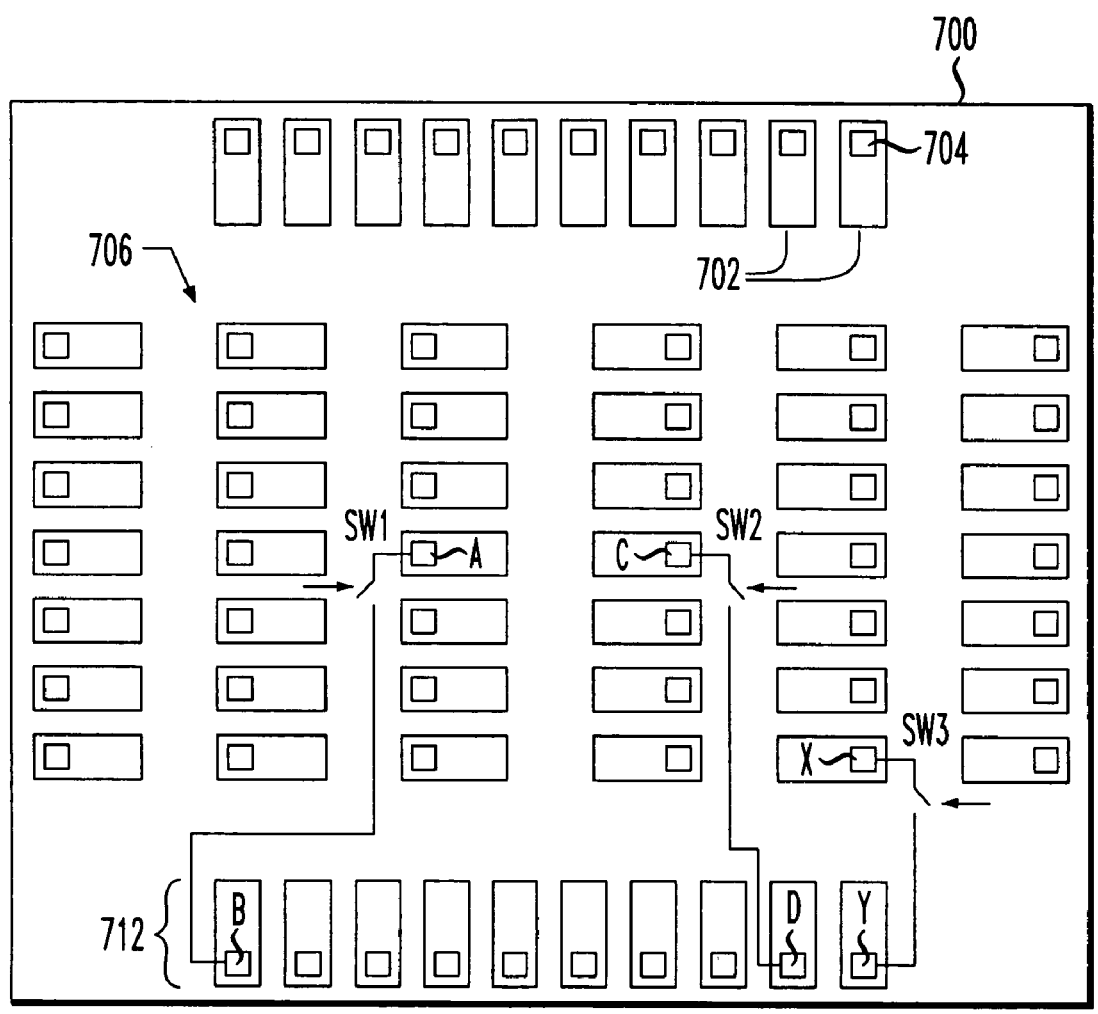
FIG. 7 shows an integrated circuit die configured in accordance with a multiple-switch embodiment of the invention.

FIG. 7 shows an example of an integrated circuit die 700 in accordance with such a multiple-switch embodiment of the invention. The integrated circuit die 700 includes a plurality of buffer circuits 702 arranged adjacent to its periphery as shown, and an area array 706 comprising additional buffer circuits 702. Associated with each of the buffer circuits 702 is a corresponding bonding pad 704. The integrated circuit die 700 includes internal bonding pad A, peripheral bonding pad B, and switch SW1, configured as in the FIG. 4 embodiment. The die 700 further includes two additional switches SW2 and SW3, coupled between respective internal-peripheral pad pairs C-D and X-Y as shown. The internal bonding pads C and X, like bonding pad A, are arranged at a location away from a periphery of the die. The peripheral bonding pads D and Y, like bonding pad B, are arranged proximate the periphery of the die, in a row 712 of peripheral bonding pads.

The operation and configuration of switches SW2 and SW3 may be substantially the same as previously described herein for switch SW1. Each switch may have an associated control circuit, or a single control circuit may be used to control multiple ones of the switches. Such control circuits are omitted from the figure for clarity and simplicity of illustration.

Other multiple-switch embodiments of the invention may include more or fewer than the particular number of switches shown in FIG. 7.

The above-described embodiments of the invention are intended to be illustrative only. Numerous alternative embodiments may be devised by those skilled in the art without departing from the scope of the following claims. For example, numerous alternative configurations of integrated circuit elements such as area arrays, buffer circuits, signal pads, switches or control circuits can be used. Also, as indicated previously, the bonding pads used in certain of the illustrative embodiments can be replaced with other types of signal pads, and such pads need not have buffer circuits associated therewith. These and other alternative embodiments will be readily apparent to those skilled in the art.

What is claimed is:

1. An apparatus comprising:
   an integrated circuit die comprising an internal signal pad arranged at a location away from a periphery of the die, a peripheral signal pad arranged proximate the periphery of the die, and a switch coupled between the internal signal pad and the peripheral signal pad;
   the switch being configurable in at least a first state in which the internal signal pad is not operatively connected to the peripheral signal pad, and a second state in which the internal signal pad is operatively connected to the peripheral signal pad;
   the switch being configurable in one of the first and second states responsive to a control signal having one of first and second signal characteristics, respectively;
   wherein the switch is configured in the first state during normal operation of the integrated circuit die;
   wherein the switch is configured in the second state to permit test access to the internal signal pad via the peripheral signal pad;
   wherein the integrated circuit die further comprises a control circuit configured to generate the control signal for controlling the state of the switch; and
   wherein the control circuit comprises at least one inverter, an output of the inverter being coupled to a control signal input of the switch.

2. The apparatus of claim 1 wherein at least one of the internal signal pad and the peripheral signal pad comprises a bonding pad.

3. The apparatus of claim 1 wherein at least one of the internal signal pad and the peripheral signal pad has a buffer circuit associated therewith.

4. The apparatus of claim 1 wherein the internal signal pad is part of an area array of the integrated circuit die.

5. The apparatus of claim 1 wherein the internal signal pad comprises an analog signal pad.

6. The apparatus of claim 1 wherein the switch is arranged nearer to the internal signal pad than to the peripheral signal pad.

7. The apparatus of claim 1 wherein the switch is arranged immediately adjacent to the internal signal pad, so as to minimize parasitic elements associated with the internal signal pad when the switch is in the first state.

8. The apparatus of claim 1 wherein the test access to the internal signal pad via the peripheral signal pad involves establishing electrical contact between an external probe and the peripheral signal pad.

9. The apparatus of claim 8 wherein the external probe comprises a test probe of a wire-type wafer probe card.

10. The apparatus of claim 1 wherein the switch is configured in the second state in conjunction with wafer-level testing of the integrated circuit die prior to separation of the die from a corresponding semiconductor wafer.

11. The apparatus of claim 1 wherein the control signal having one of the first and second signal characteristics comprises the control signal being at one of a first signal level and a second signal level, respectively.

12. The apparatus of claim 1 wherein the control circuit comprises first and second inverters connected in series, an output of the second inverter being coupled to a control signal input of the switch.

13. The apparatus of claim 1 wherein an input of the inverter is coupled via at least one resistor to a supply voltage terminal of the integrated circuit die.

14. The apparatus of claim 1 wherein an input of the inverter is coupled to an additional peripheral signal pad of the integrated circuit die.

15. The apparatus of claim 1 wherein the integrated circuit die is packaged within a packaged integrated circuit.

16. The apparatus of claim 1 wherein the integrated circuit die is part of a semiconductor wafer containing a plurality of dies.

17. A method of providing access to an internal signal pad of an integrated circuit die, the internal signal pad being arranged at a location away from a periphery of the die, the integrated circuit die further comprising a peripheral signal pad arranged proximate the periphery of the die and a switch coupled between the internal signal pad and the peripheral signal pad, the switch being configurable in at least a first state in which the internal signal pad is not operatively connected to the peripheral signal pad, and a second state in which the internal signal pad is operatively connected to the peripheral signal pad, the switch being configurable in one of the first and second states responsive to a control signal having one of respective first and second signal characteristics, the method comprising the steps of:
configuring the switch in the first state during normal operation of the integrated circuit die;
configuring the switch in the second state to permit test access to the internal signal pad via the peripheral signal pad;
wherein the integrated circuit die further comprises a control circuit configured to generate the control signal for controlling the state of the switch; and
wherein the control circuit comprises at least one inverter, an output of the inverter being coupled to a control signal input of the switch.

18. A packaged integrated circuit comprising:
an integrated circuit die;
a leadframe coupled to the die;
the integrated circuit die and leadframe being at least partially enclosed by a packaging material;
the integrated circuit die comprising an internal signal pad arranged at a location away from a periphery of the die, a peripheral signal pad arranged proximate the periphery of the die, and a switch coupled between the internal signal pad and the peripheral signal pad;
the switch being configurable in at least a first state in which the internal signal pad is not operatively connected to the peripheral signal pad, and a second state in which the internal signal pad is operatively connected to the peripheral signal pad;
the switch being configurable in one of the first and second states responsive to a control signal having one of first and second signal characteristics, respectively;
wherein the switch is configured in the first state during normal operation of the integrated circuit die;
wherein the switch is configured in the second state to permit test access to the internal signal pad via the peripheral signal pad;
wherein the integrated circuit die further comprises a control circuit configured to generate the control signal for controlling the state of the switch; and
wherein the control circuit comprises at least one inverter, an output of the inverter being coupled to a control single input of the switch.

* * * * *